(12) United States Patent
Govindarajan

(10) Patent No.: US 7,564,114 B2
(45) Date of Patent: Jul. 21, 2009

(54) SEMICONDUCTOR DEVICES AND METHODS OF MANUFACTURE THEREOF

(75) Inventor: Shrinivas Govindarajan, Austin, TX (US)

(73) Assignee: Qimonda North America Corp., Cary, NC (US)

( * ) Notice: Subject to any disclaimer, the term of this patent is extended or adjusted under 35 U.S.C. 154(b) by 200 days.

(21) Appl. No.: 11/644,090

(22) Filed: Dec. 21, 2006

(65) Prior Publication Data
US 2008/0149980 A1 Jun. 26, 2008

(51) Int. Cl.
*H01L 21/31* (2006.01)
*H01L 21/469* (2006.01)

(52) U.S. Cl. .............. 257/499; 438/243; 438/216; 438/287; 438/591; 257/296; 257/411; 257/E21.01; 257/E21.244; 257/E21.646

(58) Field of Classification Search .............. 438/778, 438/216, 243, 287, 591; 257/499, 296, 411, 257/E21.01, E21.244, E21.646, E29.018
See application file for complete search history.

(56) References Cited

U.S. PATENT DOCUMENTS

| | | | |
|---|---|---|---|
| 6,563,182 B2 | 5/2003 | Horikawa | |
| 6,649,514 B1 * | 11/2003 | Jiang et al. | 438/629 |
| 6,921,691 B1 | 7/2005 | Li et al. | |
| 7,101,760 B1 * | 9/2006 | Lojek | 438/260 |
| 2002/0135030 A1 | 9/2002 | Horikawa | |
| 2005/0205896 A1 | 9/2005 | Li et al. | |
| 2005/0280104 A1 | 12/2005 | Li | |
| 2005/0282329 A1 | 12/2005 | Li | |
| 2006/0051882 A1 * | 3/2006 | Doczy et al. | 438/3 |
| 2007/0148838 A1 * | 6/2007 | Doris et al. | 438/197 |

OTHER PUBLICATIONS

Edge, L.F., et al., "Suppression of Subcutaneous Oxidation During Deposition of Amorphous Lanthanum Aluminate on Silicon," Applied Physics Letters, Jun. 7, 2004, pp. 4629-4631, vol. 84, No. 23, American Institute of Physics, Melville, NY.

Edge, L.F., et al., "Thermal Stability of Amorphous LaScO3 Films on Silicon," Applied Physics Letters, 2006, pp. 062902-1-062902-3, vol. 89, American Institute of Physics, Melville, NY.

Narayanan, V., et al., "Interfacial Oxide Formation and Oxygen Diffusion in Rare Earth Oxide-Silicon Epitaxial Heterostructures," Applied Physics Letters, Nov. 25, 2003, pp. 4183-4185, vol. 81, No. 22, American Institute of Physics, Melville, NY.

Ono, H., et al., "Interfacial Reactions Between Thin Rare-Earth Metal Oxide Films and Si Substrates," Applied Physics Letters, Mar. 26, 2001, pp. 1832-1834, vol. 78, No. 13, American Institute of Physics, Melville, NY.

Sivasubramani, P., et al., "Outdiffusion of La and Al from Amorphous LaAlO3 in Direct Contact with Si (001)," Applied Physics Letters, 2005, pp. 201901-1-201901-3, vol. 86, American Institute of Physics, Melville, NY.

(Continued)

*Primary Examiner*—Tu-Tu V Ho
(74) *Attorney, Agent, or Firm*—Slater & Matsil, L.L.P.

(57) ABSTRACT

Semiconductor devices and methods of manufacture thereof are disclosed. A preferred embodiment comprises a method of forming an insulating material layer. The method includes forming an interface layer, removing a portion of the interface layer, annealing the interface layer, and forming a dielectric material over the interface layer.

21 Claims, 4 Drawing Sheets

OTHER PUBLICATIONS

Wilk, G.D., et al., "High-k Gate Dielectrics: Current Status and Materials Properties Considerations," Journal of Applied Physics, May 15, 2001, pp. 5243-5275, vol. 89, No. 10, American Institute of Physics, Melville, NY.

Zhao. C., et al., "Ternary Rare-Earth Metal Oxide High-k Layers on Silicon Oxide," Applied Physics Letters, 2005, pp. 132903-1-132903-3, vol. 86, American Institute of Physics, Melville, NY.

Deloach, J.D., et al., "Growth-Controlled Cubic Zirconia Microstructure in Zirconia-Titania Nanolaminates," J. Vac. Sci. Technol. A 20(5), Sep./Oct. 2002, pp. 1517-1524.

Qadri, S.B., et al., "Structural Stability of $ZrO_2$-$Al_2O_3$ Thin Films Deposited by Magnetron Sputtering," J. Vac. Sci. Technol. A 7 (3), May/Jun. 1989, pp. 1220-1224.

Sayan, S., et al., "Thermal Decomposition Behavior of the $HfO_2$/$SiO_2$/Si System," Journal of Applied Physics, vol. 94, No. 2, Jul. 15, 2003, pp. 928-934.

Scanlan, C.M., et al., "Tetragonal Zirconia Growth by Nanolaminate Formation," Appl. Phys. Lett., vol. 64, No. 26, Jun. 27, 1994, pp. 3548-3550.

Cartier, E., et al., "Role of Oxygen Vacancies in $V_{FB}$/$V_t$ Stability of pFET Metals on $HfO_2$," 2005 Symposium on VLSI Technology Digest of Technical Papers, 12B-3, 2005, pp. 230-231.

Gavartin, J.L., et al., "Negative Oxygen Vacancies in $HfO_2$ as Charge Traps in High-$k$ Stacks," Applied Physics Letters, vol. 89, No. 8, 2006, pp. 082908-1-082908-3.

Ruzyllo, J., "Semiconductor OneSource: Semiconductor Materials," http://www.semi1source.com/materials/downloaded Feb. 12, 2007, 2 pages.

Li, P., et al., "Effect of Dopants on Zirconia Stabilization-An X-ray Absorption Study: I, Trivalent Dopants," J. Am. Ceram. Soc., vol. 77, No. 1, 1994, pp. 118-128.

Wang, J., et al., "Review Hafnia and Hafnia-Toughened Ceramics," Journal of Materials Science, vol. 27, 1992, pp. 5397-5430.

Van Dover, R.B., "Amorphous Lanthanide-Doped $TiO_x$ Dielectric Films," Applied Physics Letters, vol. 74, No. 20, May 17, 1999, pp. 3041-3043.

Chen, S., et al., "Superior Electrical Properties of Crystalline $Er_2O_3$ Films Epitaxially Grown on Si Substrates," Applied Physics Letters, vol. 88, No. 22, 2006, pp. 222902-1-222902-3.

Lee, H., et al., "Electrical Characteristics of a Dy-Doped $HfO_2$ Gate Dielectric," Applied Physics Letters, vol. 79, No. 16, Oct. 15, 2001, pp. 2615-2617.

Fissel, A., et al., "Interface Formation during Molecular Beam Epitaxial Growth of Neodymium Oxide on Silicon," Journal of Applied Physics, vol. 99, No. 7, pp. 074105-1-074105-6.

Wagner, M., et al., "Gadolinium Scandate Thin Films as an Alternative Gate Dielectric Prepared by Electron Beam Evaporation," Applied Physics Letters, vol. 88, No. 17, 2006, pp. 172901-1-172901-3.

"Lanthanide," Wikipedia, http://en.wikipedia.org/wiki/Lanthanide, downloaded Nov. 28, 2006, 2 pages.

"Transition Metal," Wikipedia, http://en.wikipedia.org/wiki/Transition_metal, downloaded Nov. 28, 2006, 5 pages.

"Rare Earth Element," Wikipedia, http://en.wikipedia.org/wiki/Rare_earth_element, downloaded Nov. 28, 2006, 1 page.

Koike, M., et al., "Effect of Hf-N Bond on Properties of Thermally Stable Amorphous HfSiON and Applicability of this Material to Sub-50nm Technology Node LSIs," IEEE, Mar. 2003, 4 pages.

Christen, H.M., et al., "Dielectric and Optical Properties of Epitaxial Rare-Earth Scandate Films and Their Crystallization Behavior," Applied Physics Letters, vol. 88, No. 26, 2006, pp. 262906-1-262906-3.

Kim, K.H., et al., "Atomic Layer Deposition of Gadolinium Scandate Films with High Dielectric Constant and Low Leakage Current," Applied Physics Letters, vol. 89, No. 13, 2006, pp. 133512-1-133512-3.

\* cited by examiner

SEMICONDUCTOR DEVICES AND METHODS OF MANUFACTURE THEREOF

TECHNICAL FIELD

The present invention relates generally to the fabrication of semiconductors, and more particularly to methods of forming high dielectric constant insulating materials.

BACKGROUND

Generally, semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (IC's). There may be a plurality of transistors, memory devices, switches, conductive lines, diodes, capacitors, logic circuits, and other electronic components formed on a single die or chip.

Insulating materials comprise dielectric materials that are used in many types of semiconductor devices. Silicon dioxide ($SiO_2$) is a common dielectric material used in semiconductor device manufacturing, for example, which has a dielectric constant or k value of about 3.9. Some semiconductor applications require the use of a high k dielectric material having a higher k value than the k value of silicon dioxide, for example. Some transistors require a high k dielectric material as a gate dielectric material, and some capacitors require a high k dielectric material as an insulating material between two conductive plates, as examples, to reduce leakage current and reduce capacitance.

A dynamic random access memory (DRAM) is a memory device that can be used to store information. A DRAM cell in a memory array typically includes two elements: a storage capacitor and an access transistor. Data can be stored into and read out of the storage capacitor by passing a charge through the access transistor and into the capacitor. The capacitance or amount of charge held by the capacitor per applied voltage is measured in farads and depends upon the area of the plates, the distance between them, and the dielectric value of the insulator, as examples.

High k dielectric materials are typically used as insulating materials in the storage capacitor of DRAM cells. Examples of some high k dielectric materials that have been proposed as capacitor dielectric materials are hafnium oxide and hafnium silicate. However, these materials are limited to a maximum dielectric constant of around 30, for example.

What are needed in the art are improved high dielectric constant (k) dielectric materials and methods of formation thereof in semiconductor devices.

SUMMARY OF THE INVENTION

These and other problems are generally solved or circumvented, and technical advantages are generally achieved, by preferred embodiments of the present invention, which provide improved methods of forming high k dielectric materials and structures thereof.

In accordance with a preferred embodiment of the present invention, a method of forming an insulating material includes forming an interface layer, removing a portion of the interface layer, and annealing the interface layer. A dielectric material is formed over the interface layer.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
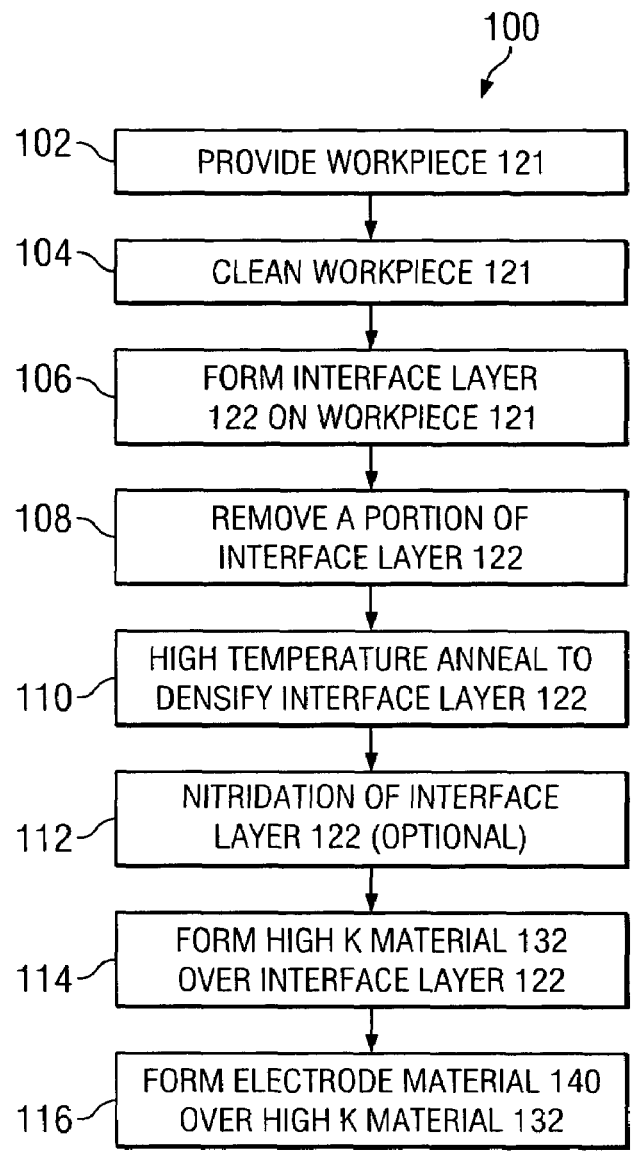
FIG. 1 is a flow chart illustrating a method of forming a high k dielectric material in accordance with a preferred embodiment of the present invention, wherein the high k dielectric material includes a well-controlled interface layer that is densified by annealing.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In conventional methods of forming high k dielectric materials, an interfacial oxide is formed between the silicon substrate and the high k dielectric material deposited. The interfacial oxide may be comprised of silicon dioxide, for example. In capacitors and transistors, the interfacial oxide degrades the effective capacitance of the dielectric stack which includes the high k dielectric material and the interfacial oxide, because the capacitance of the interfacial layer is in series with the capacitance of the high k dielectric material. The silicon dioxide interfacial oxide also increases the effective oxide thickness (EOT) of the dielectric stack and lowers the dielectric constant k of the dielectric stack.

In some applications, a final cleaning step is used before the formation of a high k dielectric material in an attempt to remove the interfacial oxide. The final cleaning step may comprise a hydrogen fluoride (HF) cleaning process, for example. The final cleaning step may result in difficulties with uniform nucleation of subsequently deposited atomic layer deposition (ALD) dielectric films and high k dielectric films deposited by other methods, for example. In addition, the deposition process may result in the formation of a non-stoichiometric, defective oxide layer.

Recent attempts have been made to form interfacial oxides such as $LaAlO_3$ or $LaScO_3$ over the substrate after the final cleaning step prior to forming a high k dielectric material. However, such approaches have not been successful for several reasons. These insulating materials are difficult to deposit and exhibit poor thermal stability after extended high temperature treatments. Interfacial oxides of $LaScO_3$ result in an interfacial oxide that is deficient in Sc after relatively low temperatures for short amounts of time; e.g., after temperatures of about 800 degrees C. for 10 seconds. Interfacial oxides of $LaAlO_3$ are problematic because the La and Al tend to diffuse into the silicon substrate at relatively low temperatures; e.g., during rapid thermal anneal (RTA) processes at about 935 degrees C.

Thus, what are needed in the art are methods of forming high k dielectric materials and structures thereof wherein the interfacial oxide formation is well-controlled, does not excessively increase the capacitance or EOT of the dielectric stack, does not excessively decrease the k value of the dielectric stack, results in an interfacial oxide that is stoichometrically sound, and is capable of withstanding high temperature budgets, e.g., during subsequent processing of the semiconductor device.

The present invention will be described with respect to preferred embodiments in a specific context, namely the formation of high k dielectric materials in semiconductor devices such as capacitors and transistors. The invention may also be applied, however, to the formation of dielectric materials in other applications where a high k dielectric material is required, for example.

Embodiments of the present invention provide methods of controlling the quality and thickness of an interfacial layer formed prior to a high k dielectric material formation, resulting in reduced capacitance and reduced EOT of the entire dielectric stack. Embodiments of the present invention achieve technical advantages by providing novel processing solutions for the formation of high k dielectric materials. A well-controlled interface layer is formed over a workpiece before forming the high k dielectric material, minimizing EOT growth during subsequent high thermal budget operations. The novel dielectric stacks comprising the interface layers and high k dielectric materials to be described herein have a high k value, a low leakage current, good uniformity, and high temperature thermal stability.

To summarize a preferred embodiment of the present invention, first, an interface layer comprising a good quality thermal oxide is formed over a workpiece or substrate, followed by a wet etch of the thermal oxide to the desired thickness. The thermal oxide is then subjected to a high temperature RTA in a controlled ambient to densify the oxide. Subsequently, a nitridation treatment is provided to form a thin nitrided surface layer on the thermal oxide. A high k dielectric material is then deposited on the nitrided thermal oxide. The manufacturing process is continued, including the steps of a post deposition anneal process, the formation of a metal electrode, and an activation anneal process. Alternatively, the thermal oxide may be replaced by a ternary oxide including a rare earth metal, to be described further herein.

Referring first to FIG. 1, a flow chart 100 is shown. The flow chart 100 illustrates a processing method for forming an interface layer 122 and a high k dielectric material 132 of a semiconductor device 120 (see FIG. 2) in accordance with a preferred embodiment of the present invention. FIGS. 2 through 6 show cross-sectional views of the semiconductor device 120 in accordance with an embodiment of the present invention at various stages of manufacturing, wherein the interface layer 122 and the high k dielectric material 132 are formed on a planar semiconductor device 120. The novel processing methods described herein may also be formed on non-planar structures.

Figure 2:
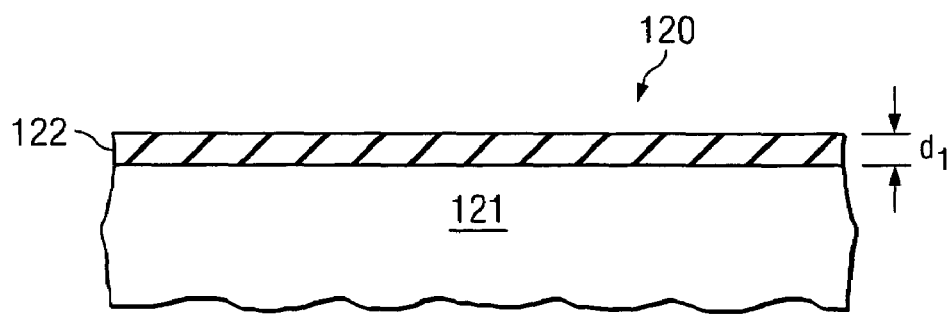
FIGS. 2 through 6 show cross-sectional views of a semiconductor device in accordance with an embodiment of the present invention at various stages of manufacturing.

Referring to the flow chart 100 in FIG. 1 and also to the semiconductor device 120 shown in FIG. 2, first, a workpiece 121 is provided (step 102). The workpiece 121 may include a semiconductor substrate comprising silicon or other semiconductor materials covered by an insulating layer, for example. The workpiece 121 may also include other active components or circuits, not shown. The workpiece 121 may comprise silicon oxide over single-crystal silicon, for example. The workpiece 121 may include other conductive layers or other semiconductor elements, e.g., transistors, diodes, etc. Compound semiconductors, GaAs, InP, Si/Ge, or SiC, as examples, may be used in place of silicon. The workpiece 121 may comprise a silicon-on-insulator (SOI) substrate, for example.

The workpiece 121 is cleaned (step 104). For example, the workpiece 121 may be cleaned to remove debris, native oxide, and/or contaminants. In a preferred embodiment, the workpiece 121 is cleaned with HF, for example. The workpiece 121 may alternatively be cleaned with other chemicals, acids, and/or solutions, for example. The cleaning step 104 preferably results in a good interface surface for the subsequent deposition of thin dielectric material layers thereon, for example.

An interface layer 122 is formed over the cleaned workpiece 121 (step 106), as shown in FIG. 2. The interface layer 122 formed comprises an initial thickness of $d_1$, as shown. The thickness $d_1$ of the interface layer 122 preferably comprises about 5 nm or less, and more preferably comprises about 1 to 4 nm, or example, although alternatively, the thickness $d_1$ may comprise other dimensions. In some embodiments, the thickness $d_1$ of the interface layer 122 preferably comprises about 2 to 3 nm. The thickness $d_1$ is preferably sufficient to form an interface layer 122 comprising an insulating material layer having good uniformity. The thickness $d_1$ is preferably greater than the desired thickness of the interface layer in the end product 120, for example. The interface layer 122 preferably comprises an oxide, for example, although the interface layer 122 may alternatively comprise other insulating materials.

The interface layer 122 is preferably formed by thermal oxidation of the workpiece 121 top surface, in some embodiments. For example, if the workpiece 121 comprises Si, the workpiece 121 may be exposed to a steam-based thermal oxide deposition process to form $SiO_2$ having a thickness of about 2 to 3 nm, or about 5 nm or less, over the workpiece 121.

Alternatively, the interface layer 122 preferably comprises a ternary oxide, in other embodiments. The ternary oxide preferably comprises $LaAlO_3$, $La(RE)O_3$, and/or $Sc(RE)O_3$, for example, wherein RE comprises a rare earth metal. The rare earth metal RE preferably comprises Scandium (Sc), Yttrium (Y), and/or an element in the Lanthanide series of the periodic table of elements, such as Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb), and/or Lutetium (Lu), as examples.

The deposition process of the ternary oxide of the interface layer 122 is preferably well-controlled and produces an interface layer 122 that is free of silicon oxide between the interface layer 122 and the workpiece 121. The ternary oxide is preferably deposited using physical vapor deposition (PVD) or molecular beam epitaxy (MBE) to achieve the silicon dioxide-free interface, for example. However, if the workpiece 121 comprises high aspect ratio features (not shown in FIG. 2; see FIGS. 10 and 11), then preferably atomic layer deposition (ALD) is used to form the interface layer 122, for example. Precursors for the formation of the interface layer 122 may include metal amidinates such as Sc-tris (N, N'-diethlyacetamidinate) or Gd tris (N, N'-disopropylacetamidinate), as examples, although other precursors may also be used. The interface layer 122 may be formed by PVD, MBE, ALD, chemical vapor deposition (CVD), pulsed laser deposition (PLD), or other deposition methods, as examples.

Figure 3:
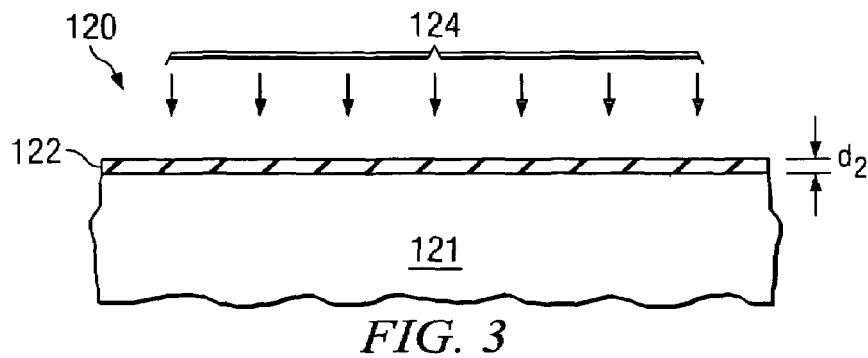

Next, a portion of the interface layer 122 is removed (step 108) using a removal process 124, as shown in FIG. 3. The removal process 124 may comprise a wet or dry etch process, or a cleaning step using HF, as examples, although other removal processes 124 may also be used.

The interface layer 122 comprises a thickness $d_2$ after the removal process 124 that is less than the thickness $d_1$ of the interface layer 122 after the formation thereof. Preferably, about one half or greater of the interface layer 122 is removed during the removal process 124, for example. More preferably about one quarter or greater of the interface layer 122 is removed during the removal process 124, for example. The interface layer 122 primarily comprises a sacrificial layer that is formed thicker than desired to form a good quality interface and a good quality material, yet a majority of the interface layer 122 as deposited is later removed, leaving behind a thinner interface layer 122 having a reduced thickness $d_2$ that has a very good quality.

In some embodiments, the interface layer 122 preferably comprises a thickness of about 1 nm or less after the removal process 124, for example. More preferably, the interface layer 122 comprises a thickness of about 0.5 to 0.8 nm after the removal process 124, as another example. Alternatively, the interface layer 122 may comprise other dimensions after the removal process 124, for example.

Figure 4:
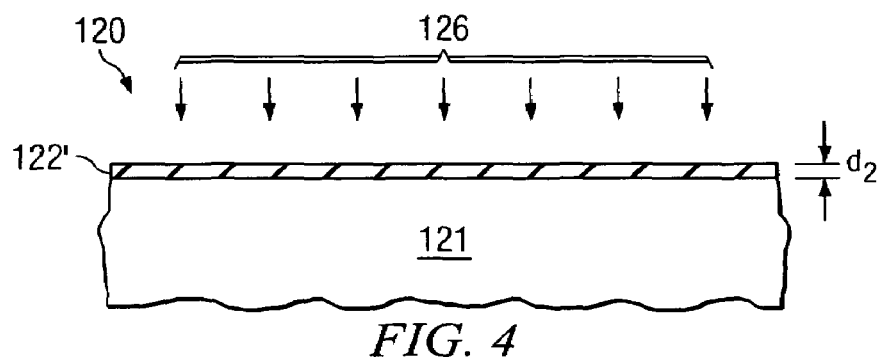

Next, the interface layer 122, e.g., the workpiece 121, is annealed using an anneal process 126 (step 110), as shown in FIG. 4. The anneal process 126 may comprise a rapid thermal anneal (RTA) process, a flash anneal process, or a spike anneal process, as examples, although alternatively, other heating processes may also be used. The anneal process 126 preferably comprises a high temperature anneal that is performed at a temperature of about 1,000 degrees C. or greater, for example. In some embodiments, the anneal process 126 comprises a temperature of between about 1,000 to 1,250 degrees C., as another example. Alternatively, the anneal process 126 may comprise other temperatures, for example.

In some embodiments, the anneal process 126 preferably comprises a flash anneal process at about 1,000 to 1,250 degrees C., e.g., wherein the workpiece 121 is heated above a baseline temperature of about 600 degrees C. at a ramp rate, increasing the temperature at a rate of about 400 degrees C./second or greater, for example. The flash anneal process 126 may be adapted to heat the workpiece 121 at a faster rate and more quickly than if a RTA or spike anneal process is used, for example. Alternatively, the flash anneal process may comprise other baseline temperatures and ramp rates, for example.

In other embodiments, the anneal process 126 preferably comprises a spike anneal process, wherein the temperature is ramped slowly to a certain temperature and then "spiked" to the desired set point, e.g., about 1,000 to 1,250 degrees C. In a spike anneal process 126, the workpiece 121 may be heated above a baseline temperature of about 600 degrees C. at a ramp rate of about 60 to 100 degrees C./second, for example. The spike anneal process may comprise other baseline temperatures and ramp rates, for example.

Alternatively, the anneal process 126 may comprise a standard RTP based process having a slower temperature ramp or increase than if a flash or spike anneal process is used, for example.

The anneal process 126 advantageously causes the interface layer 122 to densify and form a densified interface layer 122', as shown in FIG. 4. The molecules of the interface layer 122' are more tightly bonded together than before the anneal process 126, for example, improving the diffusion barrier properties of the densified interface layer 122'.

Figure 5:
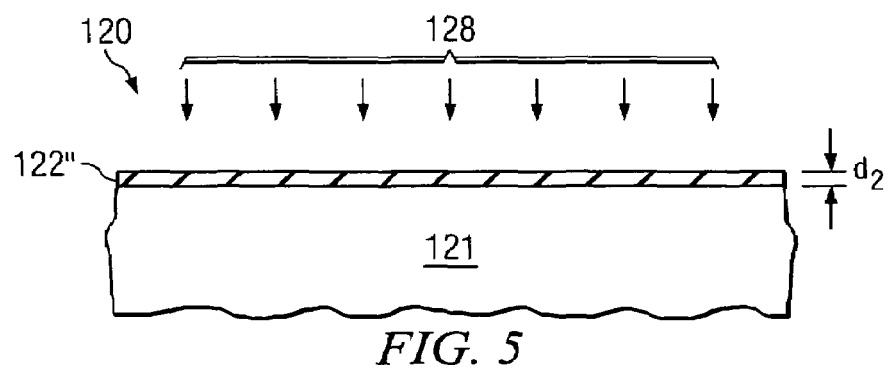

Next, an optional nitridation process 128 (step 112) may be used to form a nitride layer at least at a top surface of the interface layer 122', as shown in FIG. 5 at 122". The interface layer 122" comprises a nitrided interface layer 122", for example. The nitridation process 128 may comprise exposing the interface layer 122' to a nitrogen-containing ambient, for example.

The nitridation process 128 may include exposing the interface layer 122' to a nitrogen-containing gas or liquid such as $N_2$ or $NH_3$, exposing the interface layer 122' to a uniform surface plasma nitridation process in a plasma nitridation chamber, exposing the interface layer 122' to a thermal nitridation process, or using an implantation process, as examples. A thermal nitridation process 128 may comprise exposing the interface layer 122' to $NH_3$ at a temperature of about 550 to 800 degrees C. for about 10 to 60 seconds at a pressure of about 20 to 60 Torr, for example, although other processing parameters may also be used.

The optional nitridation process 128 advantageously forms an interface layer 122" that is heavily nitrided (e.g., forming a nitrided interface layer 122"), which further densifies the interface layer 122". If a plasma nitridation process or implantation process is used, the interface layer 122" may be nitrided only at a top surface thereof. Alternatively, the interface layer 122" may be fully nitrided throughout the thickness of the interface layer 122", forming a nitride interface layer 122".

If the interface layer 122 comprises thermally formed $SiO_2$, the interface layer 122" after the optional nitridation process 128 may comprise $SiO_xN_y$, as an example. If the interface layer 122 comprises $LaAlO_3$, $La(RE)O_3$, or $Sc(RE)O_3$, the interface layer 122" after the optional nitridation process 128 may comprise a nitride of $LaAlO_3$, $La(RE)O_3$, or $Sc(RE)O_3$, for example. Alternatively, the interface layer 122" may comprise an oxide with a nitride layer formed at a top surface thereof, e.g., the thin nitride layer at the top surface may comprise a few Angstroms, a monolayer, or a few monolayers of a nitride material.

The optional nitridation process 128 may form a surface layer which is "stuffed" with nitrogen and that acts as a diffusion barrier for upward silicon diffusion from the workpiece 121 and for oxygen or cation downward diffusion from the subsequently deposited high k dielectric material 132 (shown in FIG. 6). The interface layer 122' or 122" prevents a reaction of a subsequently-deposited material with the material layers, e.g., the workpiece 121 beneath the interface layer 122' or 122". The interface layer 122' or 122" prevents a diffusion of a subsequently-deposited material into the workpiece 121 beneath the interface layer 122' or 122", for example.

In addition, the effective dielectric constant of the interface 122" and high k dielectric material 132 is increased due to the formation of a nitrided interface layer 122," which has a higher k value than a non-nitrided interface layer 122' shown in FIG. 4, for example.

Figure 6:
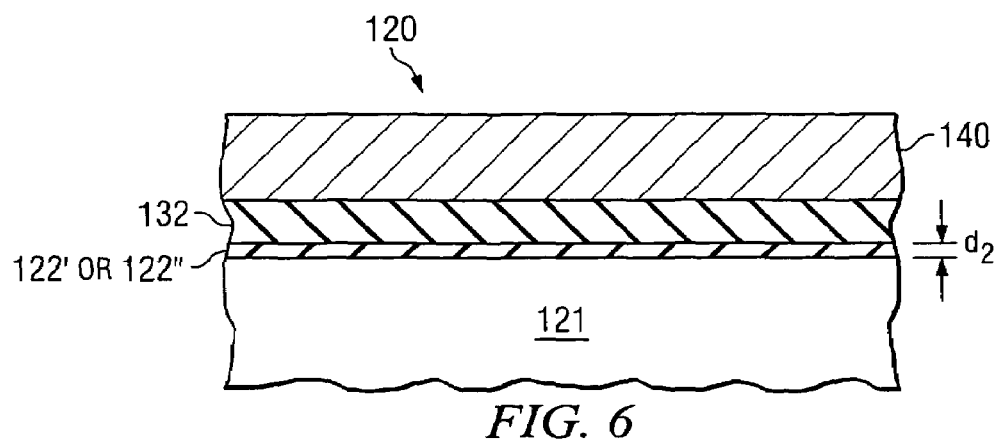

After the interface layer 122 is formed (FIG. 2), reduced in thickness (FIG. 3), annealed (FIG. 4) to form a densified interface layer 122', and optionally nitrided to form a nitrided interface layer 122" (FIG. 5), a high k dielectric material 132 is formed over the interface layer 122' or 122", as shown in FIG. 6 (step 114).

The high k dielectric material 132 and the interface layer 122' or 122" form an insulating material (122' or 122")/132, for example. The insulating material (122' or 122")/132 advantageously preferably has a high dielectric constant of greater than about 3.9, e.g., and preferably comprises a k value of about 30 or greater in some embodiments of the present invention. The insulating material (122' or 122")/132 is also referred to herein as a dielectric stack, a dielectric material stack, a high k dielectric stack or a high k dielectric material stack, for example.

The high k dielectric material 132 preferably comprises a dielectric material having a dielectric constant (k) of about 3.9 or greater, for example. The high k dielectric material 132 preferably comprises a material having a thickness of about 15 nm or less, for example, although alternatively, the high k dielectric material 132 may comprise other dimensions.

The high k dielectric material 132 preferably comprises $HfO_x$, $ZrO_x$, $LaO_x$, HfSiO, ZrSiO, LaSiO, $HfSi_xO_yN_z$, $ZrSi_xO_yN_z$, $LaSi_xO_yN_z$, laminates thereof, or multiple layers thereof, as examples. The high k dielectric material 132 may comprise one or more nanolaminate layers of $HfO_x$, $ZrO_x$, $LaO_x$, HfSiO, ZrSiO, or LaSiO with one or more nanolaminate layers of $HfSi_xO_yN_z$, $ZrSi_xO_yN_z$, or $LaSi_xO_yN_z$ disposed thereon, for example. The nanolaminate layers may be repeatedly deposited alternatingly to achieve a desired thickness and dielectric constant of the high k dielectric material 132, for example.

The high k dielectric material 132 may be deposited by ALD, MBE, PVD, PLD, or other deposition methods. The high k dielectric material 132 may optionally be nitrided, e.g., using a post deposition anneal in an $N_2$ or $NH_3$ ambient at a temperature of between about 600 to 800 degrees C., for example, although alternatively, other nitridation processes may be used. Other ambient gases may also be used in the anneal process of the high k dielectric material 132, for example, such as $N_2$, NO, $(N_2+O_2)$, or other gases.

In some embodiments, the high k dielectric material 132 may comprise one or more rare earth element, for example. The high k dielectric material 132 may comprise an oxide of at least one rare earth element, or may be an insulating material that is doped with at least one rare earth element or doped with an oxide of at least one rare earth element, for example.

In other embodiments, the high k dielectric material 132 may comprise at least one rare earth element and at least one transition metal. The at least one transition metal may be combined with an oxide of at least one rare earth element, for example. The at least one transition metal of the rare earth element-containing layer 132 may comprise at least one transition metal comprised of Titanium (Ti), Zirconium (Zr), Niobium (Nb), Hafnium (Hf), Tantalum (Ta), and/or Tungsten (W), as examples, although other transition metals may also be used. The high k dielectric material 132 may comprise an oxide of the at least one transition metal, for example.

An electrode material 140 is formed over the high k dielectric material 132, as shown in FIG. 6 (step 116). The electrode material 140 preferably comprises a conductive material such as TiN, TaN, Ru, $RuO_2$, TiSiN, TaSiN, HfSiN, TiHfN, TiCN, TaCN, TiXN, AlN, $RE_1RE_2N$, and/or multiple layers or combinations thereof, wherein X comprises a rare earth element, wherein $RE_1RE_2N$ comprises a nitride of a first rare earth element $RE_1$ and a second rare earth element $RE_2$, and wherein the second rare earth element comprises a different rare earth element than the first rare earth element, as examples, although other materials such as a semiconductor material, e.g., polysilicon may also be used. The electrode material 140 preferably comprises a thickness of about 15 nm or less, for example, although the electrode material 140 may also comprise other dimensions. The electrode material 140 is preferably deposited using ALD, although other deposition methods such as CVD, PVD, or other methods may also be used.

Next, the semiconductor device 120 may be annealed. The optional anneal process may comprise a high temperature activation anneal, for example. The anneal process preferably is performed at temperatures of between about 1,000 to 1,150 degrees C., for a duration of greater than about 10 seconds, in a nitrogen ambient including up to about 8% oxygen, as an example, although alternatively, the optional final anneal process may comprise other processing parameters. The optional final anneal process may be adapted to activate dopants in one or more of the material layers, for example.

The various material layers 140, 132, 122' or 122" are then patterned into desired shapes for the semiconductor device 120, not shown. For example, the material layer 140 that is conductive may be patterned in the shape of a capacitor plate, a transistor gate, or other conductive elements or portions of circuit elements, as examples. The material layers 132 and 122' or 122" comprising the dielectric stack that are insulators may also be patterned, for example, also not shown.

Figure 7:
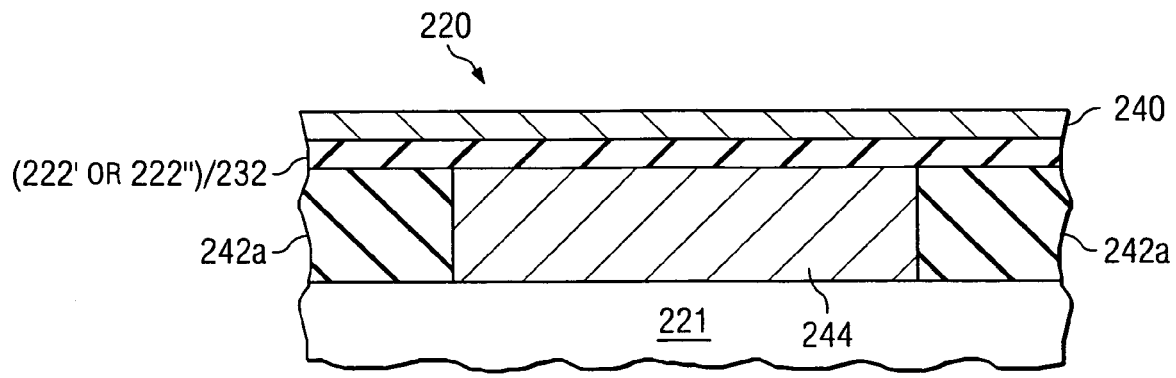
FIGS. 7 and 8 show cross-sectional views of a semiconductor device at various stages of manufacturing, wherein the novel high k dielectric material of embodiments of the present invention is implemented in a metal-insulator-metal (MIM) capacitor structure.
Figure 8:
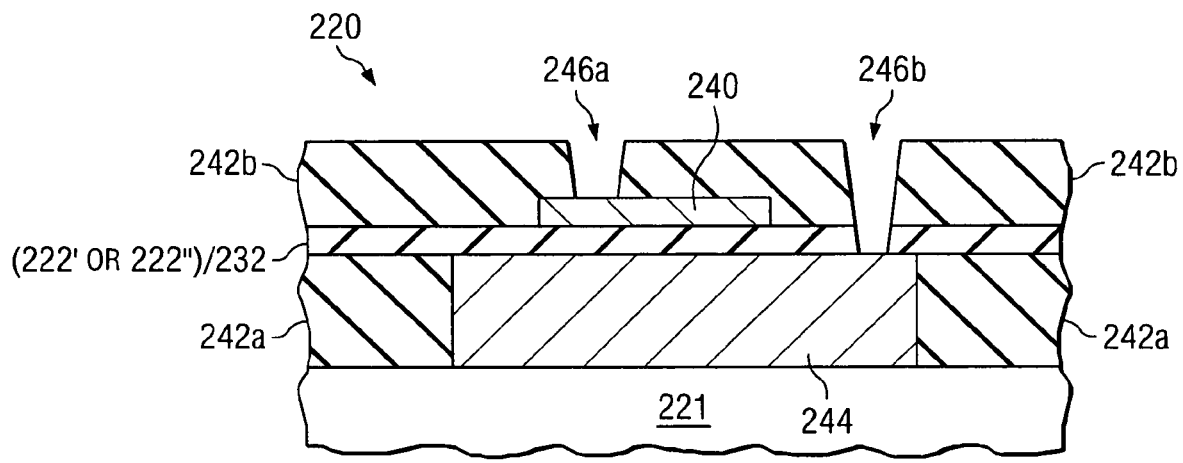

FIGS. 7 and 8 show cross-sectional views of a semiconductor device 220 at various stages of manufacturing, wherein the novel insulating material (222' or 222")/232 of embodiments of the present invention comprises a high k dielectric material stack that is implemented in a metal-insulator-metal (MIM) capacitor structure, for example. Like numerals are used for the various elements that were described in FIGS. 2 through 6. To avoid repetition, each reference number shown in FIGS. 7 and 8 is not described again in detail herein. Rather, similar materials x21, x22, x32, etc . . . are preferably used for the various material layers shown as were described for FIGS. 2 through 6, where x=1 in FIGS. 2 through 6 and x=2 in FIGS. 7 and 8.

To form the MIM capacitor, a bottom capacitor plate 244 is formed over a workpiece 221. The bottom plate may comprise a semiconductive material such as polysilicon, or a conductive material such as TiN, TaN, TiTaN, Ru, $Ru_xO$, TiHfN, TiCN, TaCN, TiXN, AlN, $Re_1Re_2N$, copper and/or aluminum, as examples. The bottom capacitor plate 244 may be formed in an insulating material 242a that may comprise an inter-level dielectric layer (ILD), for example. The bottom capacitor plate 244 may include liners and interface layers, for example, not shown.

The novel high k dielectric material stack (222' or 222")/232 described with reference to FIGS. 1 through 6 is formed over the bottom plate 244 and the insulating material 242a. An electrode material 240 is formed over the dielectric material (222' or 222")/232, as shown in FIG. 7, and the electrode material 240 is patterned to form a top capacitor plate, as shown in FIG. 8. An additional insulating material 242b may be deposited over the top capacitor plate 240, and the insulating material 242b (and also the interface layer 222' or 222" and the high k dielectric material 232) may be patterned with patterns 246a and 246b for contacts that will make electrical contact to the top plate 240 and the underlying bottom plate 244, respectively. The insulating material 242b may be filled in later with a conductive material to form the contacts in patterns 246a and 246b, for example, not shown.

Thus, in FIG. 8, a capacitor is formed that includes the two conductive plates 244 and 240 separated by an insulator which comprises the novel high k dielectric material stack (222' or 222")/232 of embodiments of the present invention. The capacitor may be formed in a front-end-of the line (FEOL), or portions of the capacitor may be formed in the back-end-of the line (BEOL), for example. One or both of the capacitor plates 224 and 240 may be formed in a metallization layer of the semiconductor device 220, for example. Capacitors such as the one shown in FIG. 8 may be used in filters, in analog-to-digital converters, memory devices, control applications, and many other types of applications, for example.

Figure 9:
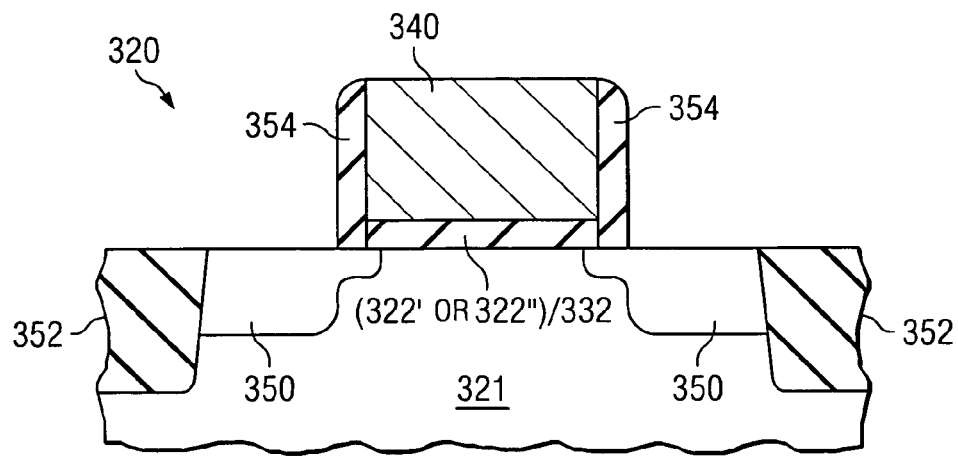
FIG. 9 shows a cross-sectional view of a semiconductor device, wherein the novel high k dielectric material of embodiments of the present invention is implemented in a transistor structure.

FIG. 9 shows a cross-sectional view of a semiconductor device 320 wherein the novel high k dielectric material stack (322' or 322")/332 of embodiments of the present invention is implemented in a transistor structure as a dielectric stack (322' or 322")/332 comprising a gate dielectric. Again, like numerals are used for the various elements that were used to describe the previous figures, and to avoid repetition, each reference number shown in FIG. 9 is not described again in detail herein.

The transistor includes a gate dielectric comprising the novel high k dielectric material stack (322' or 322")/332 described herein and a gate electrode 340 formed over the high k dielectric material stack (322' or 322")/332. Source and drain regions 350 are formed proximate the gate electrode 340 in the workpiece 321, and a channel region is disposed between the source and drain regions 350 in the workpiece 321. The transistor may be separated from adjacent devices by shallow trench isolation (STI) regions 352, and insulating spacers 354 may be formed on sidewalls of the gate electrode 340 and the gate dielectric comprising the dielectric stack (322' or 322")/332, as shown.

Figure 10:
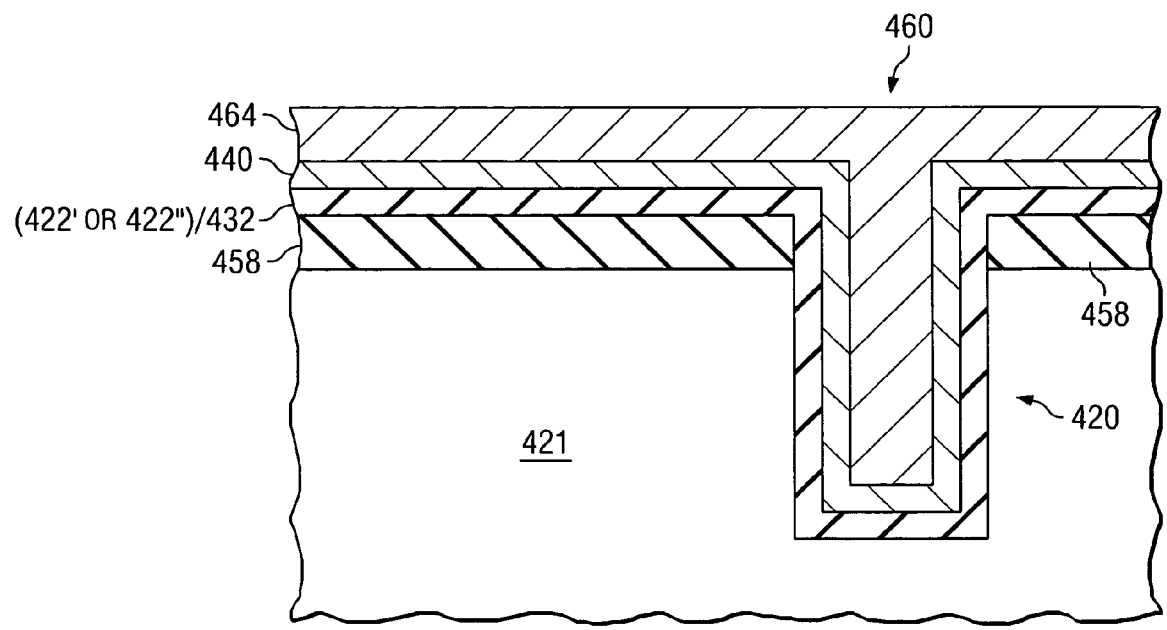
FIGS. 10 and 11 show cross-sectional views of a semiconductor device at various stages of manufacturing, wherein the novel high k dielectric material of embodiments of the present invention is implemented in a DRAM structure.
Figure 11:
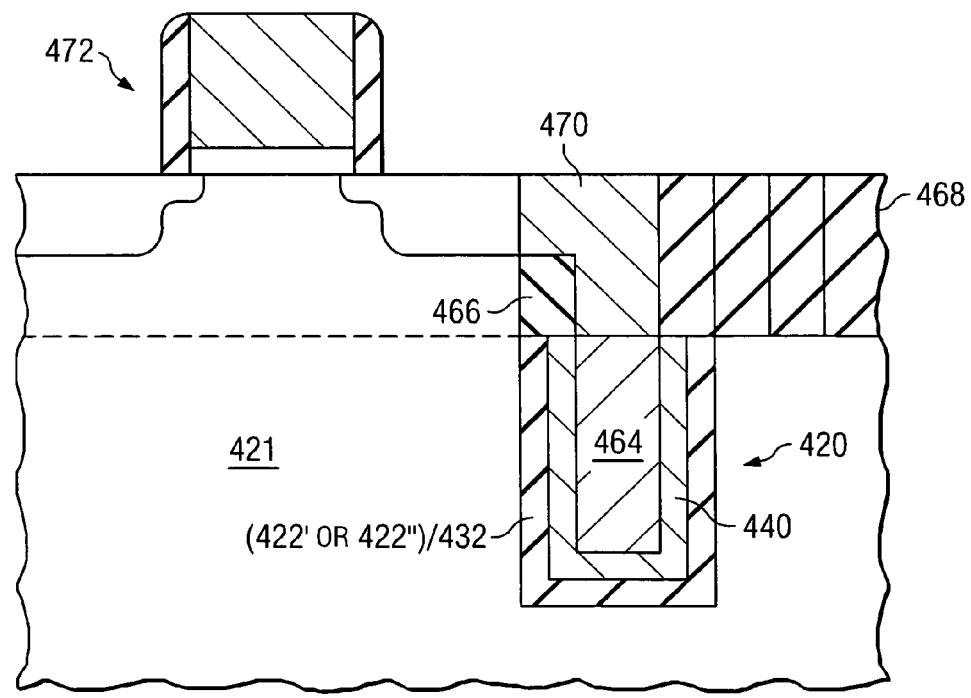

FIGS. 10 and 11 show cross-sectional views of a semiconductor device 420 at various stages of manufacturing, wherein the novel high k dielectric material stack (422' or 422")/432 of embodiments of the present invention is implemented in a DRAM structure. To form a DRAM memory cell comprising a storage capacitor utilizing the novel high k dielectric material stack (422' or 422")/432 of embodiments of the present invention, a sacrificial material 458 comprising an insulator such as a hard mask material is deposited over a workpiece 421, and deep trenches 460 are formed in the sacrificial material 458 and the workpiece 421. The novel high k dielectric material stack (422' or 422")/432 is formed over the patterned sacrificial material 458 and workpiece 421, and an electrode material 440 is formed over the high k dielectric material stack (422' or 422")/432, as shown. An additional electrode material 464 comprising polysilicon e.g., that may be doped with n or p-type doping, for example, or other semiconductor or conductive material may be deposited over the electrode material 440 to fill the trenches 460, as shown in FIG. 10.

Next, excess amounts of electrode materials 464 and 440 and dielectric material stack (422' or 422")/432 are removed from over the top surface of the workpiece 421, e.g., using a chemical mechanical polish (CMP) process and/or etch process. The materials 464 and 440, and high k dielectric material stack (422' or 422")/432 are also recessed below the top surface of the workpiece 421, for example. The sacrificial material 458 is also removed, as shown in FIG. 11.

An oxide collar 466 may be formed by thermal oxidation of exposed portions of the trench 460 sidewalls. The trench 460 may then be filled with a conductor such as polysilicon 470. Both the polysilicon 470 and the oxide collar 466 are then etched back to expose a sidewall portion of the workpiece 421 which will form an interface between an access transistor 472 and the capacitor formed in the deep trench 460 in the workpiece 421, for example.

After the collar 466 is etched back, a buried strap may be formed at 470 by deposition of a conductive material, such as doped polysilicon. Regions 464 and 470 comprising polysilicon are preferably doped with a dopant such as arsenic or phosphorus, for example. Alternatively, regions 464 and 470 may comprise a conductive material other than polysilicon (e.g., a metal).

The strap material 470 and the workpiece 421 may then be patterned and etched to form STI regions 468. The STI regions 468 may be filled with an insulator such as an oxide deposited by a high density plasma process (i.e., HDP oxide). The access transistor 472 may then be formed to create the structure shown in FIG. 11.

The workpiece 421 proximate the high k dielectric material stack (422' or 422")/432 lining the deep trench 460 comprises a first capacitor plate, the high k dielectric material stack (422' or 422")/432 comprises a capacitor dielectric, and materials 440 and 464 comprise a second capacitor plate of the deep trench storage capacitor of the DRAM memory cell. The access transistor 472 is used to read or write to the DRAM memory cell, e.g., by the electrical connection established by the strap 470 to a source or drain of the transistor 472 near the top of the deep trench 460, for example.

Embodiments of the present invention may also be implemented in other structures that require a dielectric material. For example, the novel high k dielectric material stacks (122' or 122")/132, (222' or 222")/232, (322' or 322")/332, or (422' or 422")/432 described herein may be implemented in planar transistors, vertical transistors, planar capacitors, stacked capacitors, vertical capacitors, deep or shallow trench capacitors, and other devices. Embodiments of the present invention may be implemented in stacked capacitors where both plates reside above a substrate or workpiece, for example.

Advantages of embodiments of the present invention include providing novel methods and structures having a high dielectric constant or k value. The interface layers 122', 122", 222', 222", 322', 322", 422', and 422" are formed using a well-controlled method, resulting in a good quality material for the interface between the workpiece 121, 221, 321, and 421 and the high k dielectric material 132, 232, 332, and 432. Because the interface layers 122', 122", 222', 222", 322', 322", 422', and 422" are deposited in a greater thickness initially and later thinned using the removal process 124, the interface layers 122', 122", 222', 222", 322', 322", 422', and 422" are uniformly deposited, resulting in a stoichiometrically sound material layer. The anneal process 126 densities the interface layers 122', 122", 222', 222", 322', 322", 422', and 422" and creates an excellent thermal oxide or nitride barrier layer having a high dielectric constant k, and furthermore, minimizes any further growth of the interface layers 122', 122", 222', 222", 322', 322", 422', and 422" in subsequent thermal processing of the semiconductor devices 120, 220, 320, or 420. The dielectric material stacks (122' or 122")/ 132, (222' or 222")/232, (322' or 322")/332, or (422' or 422")/ 432 and the novel interface layers 122', 122", 222', 222", 322', 322", 422', and 422" comprise thermally stable films that continue to be stable even after extended high temperature treatments.

In some embodiments, the high k dielectric materials 132, 232, 332, and 432 described herein include rare earth elements or rare earth oxides to form high dielectric constant materials. The high k materials are thermally stable and result in dielectric material stacks (122' or 122")/132, (222' or 222")/232, (322' or 322")/332, or (422' or 422")/432 having a low effective oxide thickness (EOT) and low leakage current, for example. The use of the novel interface layers 122', 122", 222', 222", 322', 322", 422', and 422" described herein prevents formation of a rare earth silicate proximate the workpiece 121, which may occur due to counter diffusion of Si with a subsequently deposited rare earth element-containing material 132, if a rare earth element-containing material such as layer 132 were to be deposited directly adjacent to the workpiece 121, for example.

The novel high k material stacks (122' or 122")/132, (222' or 222")/232, (322' or 322")/332, or (422' or 422")/432 described herein provide the ability to reduce the EOT of the high k material stacks (122' or 122")/132, (222' or 222")/232, (322' or 322")/332, or (422' or 422")/432 below about 1.5 nm with a leakage current of less than about $1 \times 10^{-7}$ A/cm$^2$, e.g., which is advantageous in applications having thermal budgets of about 1,000° C. for 30 seconds, as an example. By eliminating the possibility of formation of a rare element silicate of silicide by the use of the novel interface layers 122', 122", 222', 222", 322', 322", 422', and 422", advantageously, rare earth element-doped high dielectric constant material layers such as Hf or Zr oxides can be used for the high k dielectric material 132, 232, 332, or 432 of the dielectric material stacks (122' or 122")/132, (222' or 222")/232, (322' or 322")/332, or (422' or 422")/432 of embodiments of the present invention, advantageously resulting in the formation of low leakage, low EOT capacitors and transistors having excellent thermal stability, for example.

The dielectric stacks (122' or 122")/132, (222' or 222")/ 232, (322' or 322")/332, or (422' or 422")/432 described herein, including the high k dielectric material 132, 232, 332, and 432 and the densified interface layers 122', 222', 322', and 422' or nitrided interface layers 122", 222", 322", and 422", advantageously may have a dielectric constant of about 25 to 30 or greater in some embodiments, for example.

Referring again to FIGS. 1 through 6, the novel process of depositing the interface layer 122, removing a top portion of the interface layer 122, densifying the interface layer 122 by annealing, and optionally nitriding the interface layer 122' provide methods of controlling the quality and thickness of the interface layer 122' or 122" between the workpiece 121 and the high k dielectric material 132, thus ensuring the formation of a good quality interface layer 122' or 122".

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an insulating material, the method comprising:
    forming an interface layer;
    removing a portion of the interface layer;
    annealing the interface layer;
    exposing the annealed interface layer to nitrogen; and
    forming a dielectric material over the interface layer.

2. The method according to claim 1, wherein exposing the interface layer to nitrogen comprises: exposing the interface layer to a nitrogen-containing gas or liquid, exposing the interface layer to a plasma nitridation process, exposing the interface layer to a thermal nitridation process, or exposing the interface layer to an implantation process.

3. The method according to claim 1, wherein forming the interface layer comprises forming the interface layer by thermal oxidation, atomic layer deposition (ALD), chemical vapor deposition (CVD), physical vapor deposition (PVD), pulsed laser deposition (PLD), or molecular beam epitaxy (MBE).

4. The method according to claim 1, wherein forming the interface layer comprises forming an interface layer comprising $SiO_2$, $LaAlO_3$, $La(RE)O_3$, or $Sc(RE)O_3$, wherein RE comprises a rare earth metal.

5. The method according to claim 1, wherein forming the interface layer comprises forming an interface layer including a rare earth metal comprising Scandium (Sc), Yttrium (Y), Lanthanum (La), Cerium (Ce), Praseodymium (Pr), Neodymium (Nd), Promethium (Pm), Samarium (Sm), Europium (Eu), Gadolinium (Gd), Terbium (Tb), Dysprosium (Dy), Holmium (Ho), Erbium (Er), Thulium (Tm), Ytterbium (Yb), and/or Lutetium (Lu).

6. The method according to claim 1, wherein annealing the interface layer comprises subjecting the interface layer to a high temperature rapid thermal anneal at a temperature of between about 1,000 and 1,250 degrees C.

7. The method according to claim 1, wherein forming the dielectric material comprises forming $HfO_x$, $ZrO_x$, $LaO_x$, HfSiO, ZrSiO, LaSiO, $HfSi_xO_yN_z$, $ZrSi_xO_yN_z$, $LaSi_xO_yN_z$, laminates thereof, multiple layers thereof, one or more rare earth element, an oxide of at least one rare earth element, or at least one rare earth element and at least one transition metal.

8. A method of fabricating a semiconductor device, the method comprising:
    providing a workpiece;
    forming an interface layer directly onto a top surface of the workpiece, said interface layer having a thickness no greater than 5 nm;
    removing a top portion of the interface layer to reduce the remaining thickness of said interface layer to 1 nm or less;

annealing the workpiece at a temperature of greater than about 1,000 degrees C. subsequent to removing a top portion; and forming a dielectric material over the interface layer.

9. The method according to claim 8, wherein removing a portion of the interface layer comprises removing about one half or greater of the interface layer.

10. The method according to claim 8, wherein annealing the workpiece comprises a flash anneal process, a spike anneal process, or a rapid thermal anneal (RTA) process.

11. The method according to claim 8, wherein forming the interface layer comprises a steam based thermal oxide deposition process.

12. The method according to claim 8, wherein forming the interface layer comprises forming a ternary oxide.

13. The method of claim 9 further comprising exposing the interface layer to nitrogen subsequent to said annealing its interface.

14. A method of forming an insulating material, the method comprising: forming an interface layer directly onto the surface of a workpiece, said interface layer having a thickness no greater than 5 nm;

removing a top portion of the interface layer to reduce the thickness of said interface layer to 1 nm or less;

annealing the interface layer subsequent to removing a top portion of the interface layer; and forming a dielectric material over the interface layer.

15. A method of fabricating a semiconductor device, the method comprising:

providing a workpiece;

cleaning the workpiece;

forming an interface layer over the workpiece;

removing a portion of the interface layer so that the thickness of the interface layer comprises about 1 nm or less;

annealing the workpiece to densify the interface layer;

forming a dielectric material over the interface layer, wherein the interface layer and the dielectric material comprise an insulating material; and forming a conductive material over the dielectric material.

16. The method according to claim 15, wherein forming the dielectric material comprises forming a material having a thickness of about 15 nm or less.

17. The method according to claim 15, further comprising nitriding the interface layer after annealing the workpiece, forming a nitrided surface on the interface layer.

18. The method according to claim 17, wherein nitriding the interface layer comprises a nitridation process in a $N_2$ or $NH_3$ ambient at a temperature of between about 550 to 800° C. for about 10 to 60 seconds, or a uniform surface nitridation process in a plasma nitridation chamber.

19. The method according to claim 15, wherein forming the dielectric material comprises forming a dielectric material having a dielectric constant (k) greater than about 3.9.

20. The method according to claim 15, wherein forming the interface layer and forming the dielectric material comprise forming an insulating material comprising a gate dielectric of a transistor or a capacitor dielectric of a capacitor.

21. The method according to claim 15, wherein forming the conductive material comprises forming TiN, TaN, Ru, $RuO_2$, TiSiN, TaSiN, HfSiN, TiHfN, TiCN, TaCN, TiXN, AlN, $RE_1RE_2N$, polysilicon, and/or multiple layers or combinations thereof, wherein X comprises a rare earth element, wherein $RE_1RE_2N$ comprises a nitride of a first rare earth element $RE_1$ and a second rare earth element $RE_2$, and wherein the second rare earth element comprises a different rare earth element than the first rare earth element.

* * * * *